United States Patent
Pelicia et al.

(10) Patent No.: US 10,972,002 B1
(45) Date of Patent: Apr. 6, 2021

(54) CLAMP CIRCUIT FOR VOLTAGE REGULATOR

(71) Applicant: NXP USA, INC., Austin, TX (US)

(72) Inventors: Marcos Mauricio Pelicia, Campinas (BR); Luis Enrique Del Castillo, Campinas (BR); Eduardo Ribeiro da Silva, Campinas (BR); Ivan Carlos Ribeiro do Nascimento, Campinas (BR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/880,488

(22) Filed: May 21, 2020

(51) Int. Cl.
    *G11C 27/02* (2006.01)
    *H02M 3/07* (2006.01)

(52) U.S. Cl.
    CPC ............. *H02M 3/07* (2013.01); *G11C 27/02* (2013.01)

(58) Field of Classification Search
    CPC ................................. G11C 27/02; H02M 3/07
    USPC ....... 327/534, 535, 536, 537, 538, 540, 541, 327/543
    See application file for complete search history.

(56) References Cited

U.S. PATENT DOCUMENTS

| | | | |
|---|---|---|---|
| 5,357,156 A | 10/1994 | Herrington | |
| 5,617,283 A | 4/1997 | Krakauer et al. | |
| 7,532,445 B2 * | 5/2009 | Rana | H02H 9/041 327/536 |
| 9,203,236 B2 * | 12/2015 | Seberger | H02H 1/0007 |
| 2015/0222180 A1 * | 8/2015 | Deguchi | H02M 3/156 323/282 |

OTHER PUBLICATIONS

Ker, M., Overview on Electrostatic Discharge Protection Designs for Mixed-Voltage I/O Interfaces: Design Concepts and Circuit Implementations. IEEE Transactions on Circuits and Systems,—1: Regular Papers, vol. 53, No. 2, Feb. 2006.

* cited by examiner

*Primary Examiner* — William Hernandez
(74) *Attorney, Agent, or Firm* — David G. Dolezal

(57) ABSTRACT

A regulator clamp circuit includes a comparison circuit having a sample and hold circuit. The comparison circuit compares a regulated voltage with a sampled voltage of the regulated voltage from a previous time. In some embodiments, the sampled voltage can be determined during a sampling phase that occurs prior to a clamp regulation phase. During the clamp regulation phase, the comparison circuit compares the regulated voltage with the sampled voltage and outputs a signal to activate an actuator circuit to clamp the regulated voltage when the regulated voltage terminal has a higher amount of charge than desired.

23 Claims, 8 Drawing Sheets

CLAMP CIRCUIT FOR VOLTAGE REGULATOR

BACKGROUND OF THE INVENTION

Field of the Invention

This invention relates in general to a voltage regulation.

Description of the Related Art

Voltage regulators are utilized for providing regulated voltages to electronic circuitry.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a regulator clamp circuit includes a comparison circuit having a sample and hold circuit. The comparison circuit compares a regulated voltage with a sampled voltage of the regulated voltage from a previous time. In some embodiments, the sampled voltage can be determined during a sampling phase that occurs prior to a clamp regulation phase. During the clamp regulation phase, the comparison circuit compares the regulated voltage with the sampled voltage and outputs a signal to activate an actuator circuit to clamp the regulated voltage when the regulated voltage terminal has a higher amount of charge than desired. The sample phase and clamp regulation phase can be initiated in response to a power transition event where abrupt changes in a supply voltage and/or load can cause spikes in the regulated voltage.

In some embodiments, providing a regulator clamp circuit with a sample and hold device that can be selectively activated for anticipated power transition events may allow for a voltage regulator system that consumes less power during a steady state operation but provides a current clamp path during a power transition event for a faster transient response in maintaining the regulated voltage.

In order to reduce power during operation, some voltage regulators do not include a clamp circuit (e.g. a current sink) to reduce charge (either positive or negative) on a regulator output to regulate the voltage. One drawback of these types of regulators is that they have slower response times to power transition events, which can lead to disturbances in the output voltage during such events. For example, a fast transition in load current may cause a spike in the regulated voltage. With no clamp capability, the regulator output voltage may take a relatively long time to settle back into regulation. On small output capacitor regulators like cap-less or back biasing regulators, where the output capacitance is in a range of 10-100 nF, such a voltage spike may be relatively large.

Reverse Back-Biasing (RBB) regulators present a particular current injection case where there is capacitive coupling between the circuit supply voltage and the Nwell and Pwell regions underneath a logic circuit. Fast supply transitions during partial power gating turn-on/off power transition events can disturb the well nodes leading to Safe Operating Area (SOA) violations and timing disruptions.

Figure 1:
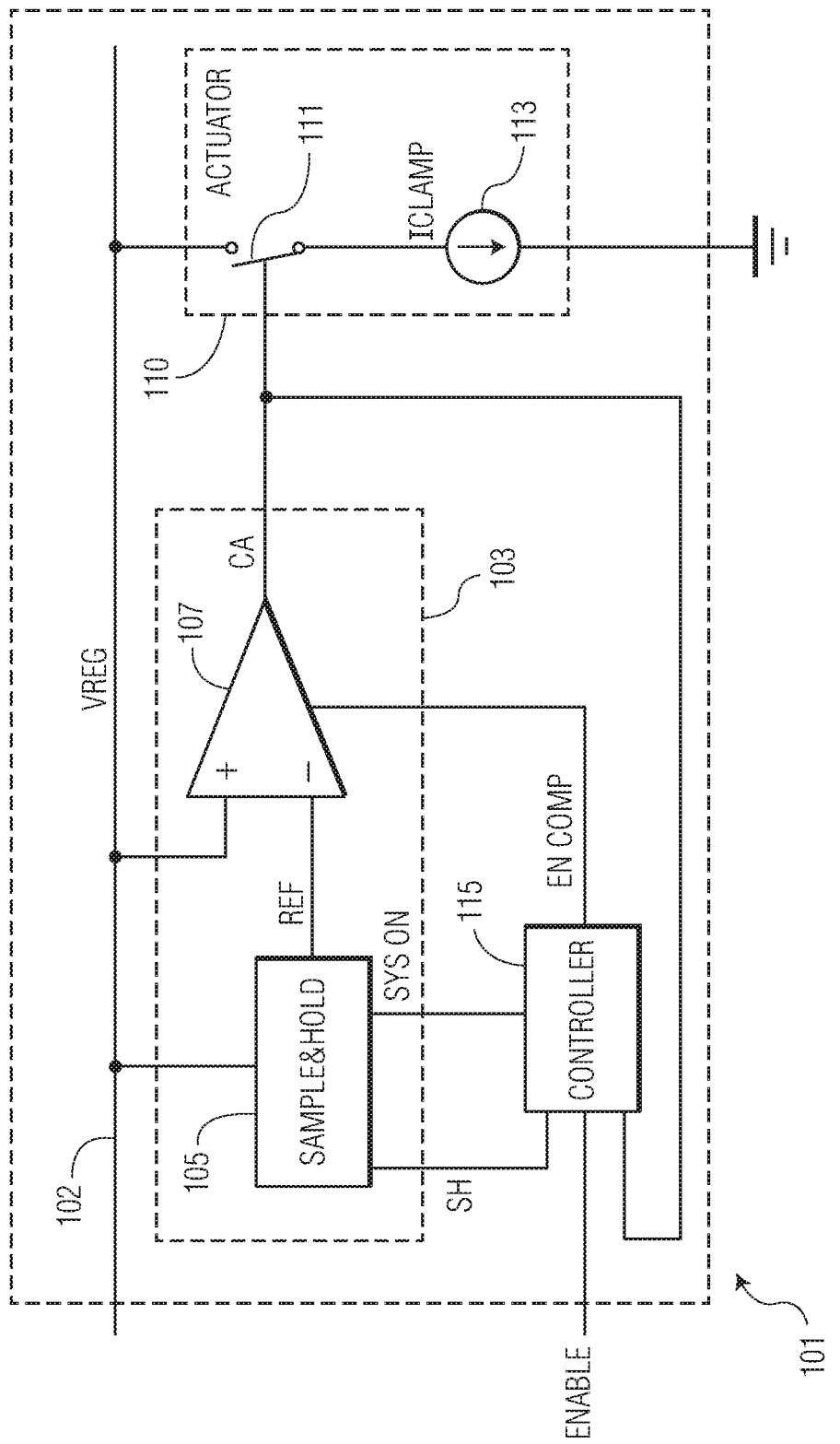
FIG. 1 is a circuit diagram a regulator clamp circuit according to one embodiment of the present invention.

FIG. 1 is a circuit diagram of a regulator clamp circuit according to one embodiment of the present invention. Circuit 101 includes a comparison circuit 103 and an actuator circuit 110 that is used to reduce the charge on an output voltage terminal 102 that provides a regulated voltage VREG. Actuator circuit 110 includes a switch 111 and a current source 113 that provides a charge reduction current ICLAMP. Switch 111 is activated by the output (CA) of comparison circuit 103 to clamp the voltage of terminal 102 during a power transition event by reducing the charge on terminal 102. When switch 111 is closed, the charge on terminal 102 is discharged at the rate of current ICLAMP.

Comparison circuit 103 includes a comparator 107 and sample and hold device 105. Circuit 101 includes a controller 115 that controls the operation of sample and hold device 105 and comparator 107. In the embodiment shown, sample and hold device 105 provides an indication (REF) of a sampled voltage to the inverting input of comparator 107. The non-inverting input of comparator 107 receives the regulated voltage VREG that is produced by the output (terminal 102) of the voltage regulator (see regulator 713 of FIG. 7). Based on the comparison of the sampled voltage and the regulated voltage (VREG), comparator 107 activates actuator circuit 110 to clamp the voltage of the output of the regulator to reduce VREG to specified levels during power transition events. Controller 115 also provides an enable comparison signal (ENCOMP) that is used to enable comparator 107 during a clamp regulation phase. Controller 115 also provides an SH signal and a SYSTEM ON signal to the sample and hold device 105 during a sample phase where a voltage indicative of the sampled voltage of VREG is stored on the sample and hold device 105.

Figure 2:
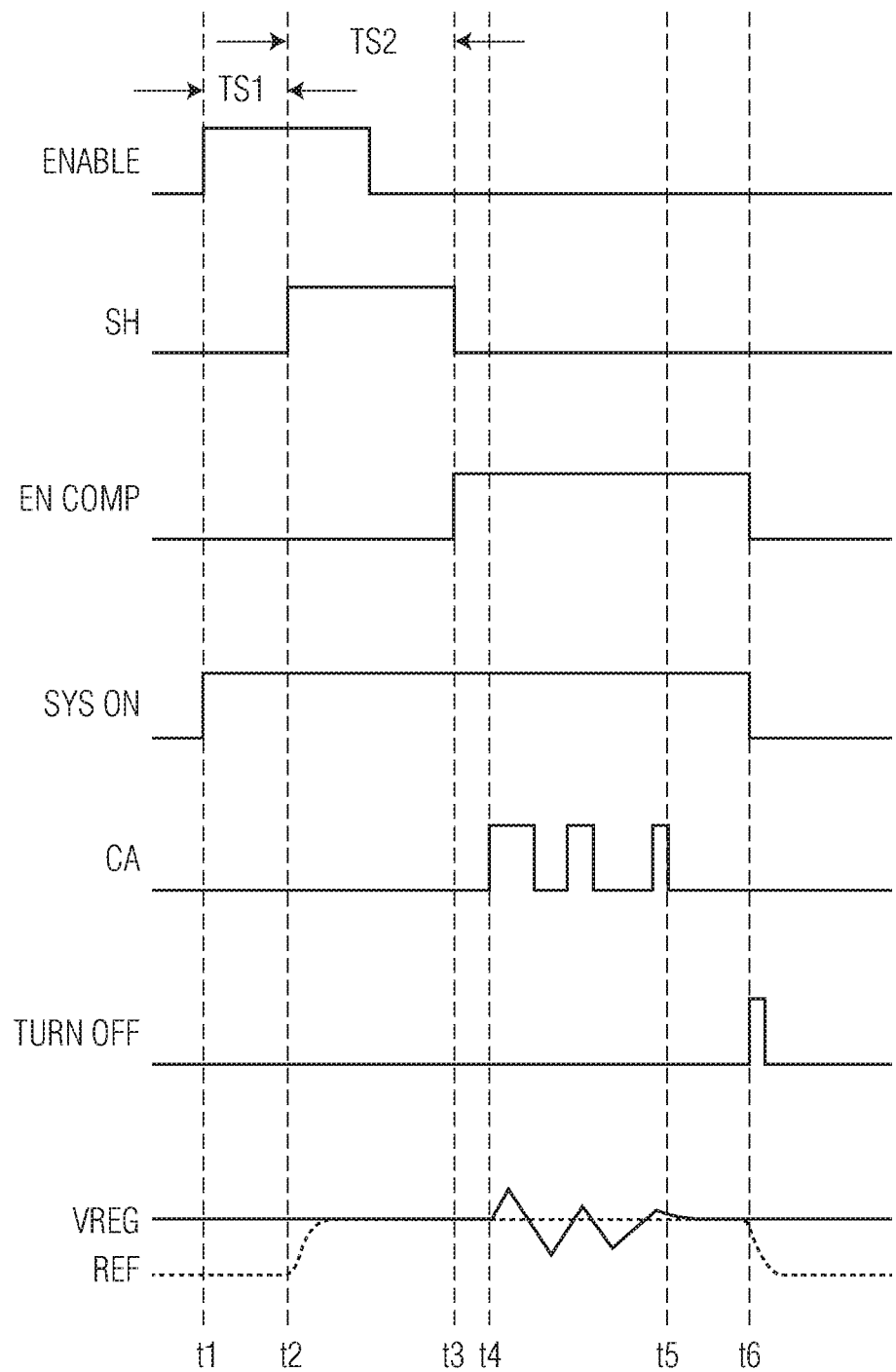
FIG. 2 is a timing diagram showing signals of a regulator clamp circuit according to one embodiment of the present invention.

FIG. 2 is a timing diagram of the circuit of FIG. 1. The ENABLE signal is provided to system controller 115 (e.g. from a power controller (e.g. controller 725 of FIG. 7)) or system processor when a power transition event will occur in a system. Examples of power transition events include when portions of a system may be powered up or powered down such as when the system (or portions thereof) enters a low power mode. Other examples include changes in the supply voltage as when a system is entering or exiting a lower power mode. In still other embodiments, a power transition event may occur during the start-up of a system or during changes in system activity such as during a memory access operation or the coupling injection from an EMI source.

When a power transition event is likely to occur, a system controller (not shown in FIG. 1) asserts the ENABLE signal to controller 115 just prior to the event. In response to receiving the asserted ENABLE signal at time T1, controller 115 at time T2, asserts the SH signal to initiate a sample phase where a voltage indicative of the regulated voltage is stored in the sample and hold device 105. In one embodiment, the SH signal is asserted 1 millisecond after the ENABLE signal is received, but that time may be different in other embodiments. During the sample phase, the voltage regulator is operating at a steady state where the regulated voltage VREG is relatively steady. In some embodiments, the sampling phase lasts 2 microseconds and is completed before the start of the power transition event. However, the length of the sample phase may be different in other embodiments.

At the end of the sample phase at time T3, controller 115 asserts the enable comparator signal EN COMP to start the clamp regulation phase. In the embodiment shown, during the clamp regulation phase, comparator 107 compares whether the regulated voltage VREG is above the sampled voltage (REF). If the regulated voltage is above the sampled voltage, comparator 107 asserts its output CA to clamp the regulated voltage VREG by actuator circuit 110. Once the regulated voltage VREG drops below the sampled voltage, CA is de-asserted and actuator circuit 110 is deactivate wherein the regulated voltage VREG rises due to charge being provided by a charge pump (not shown) in some embodiments. When the voltage rises above the sampled voltage again, comparator 107 asserts its output to activate the actuator circuit 110 until the regulated voltage falls below the sampled voltage.

After the occurrence of the power transition event, the load on the regulator becomes more constant such that the regulated voltage is maintained around the sampled voltage. After the CA signal has not been asserted for a specific amount of time, controller 115 produces the TURN OFF signal to end the clamp regulation phase where in the embodiment shown, the comparator enable signal (EN COMP) is de-asserted to deactivate comparison circuit 103. At this time, the voltage regulator is in steady state operation. During steady state, the relatively constant current drain of the load discharges terminal 102 such that the voltage of VREG is maintained at its regulated value. Other clamp circuits may operate in other ways in other embodiments.

Figure 3:
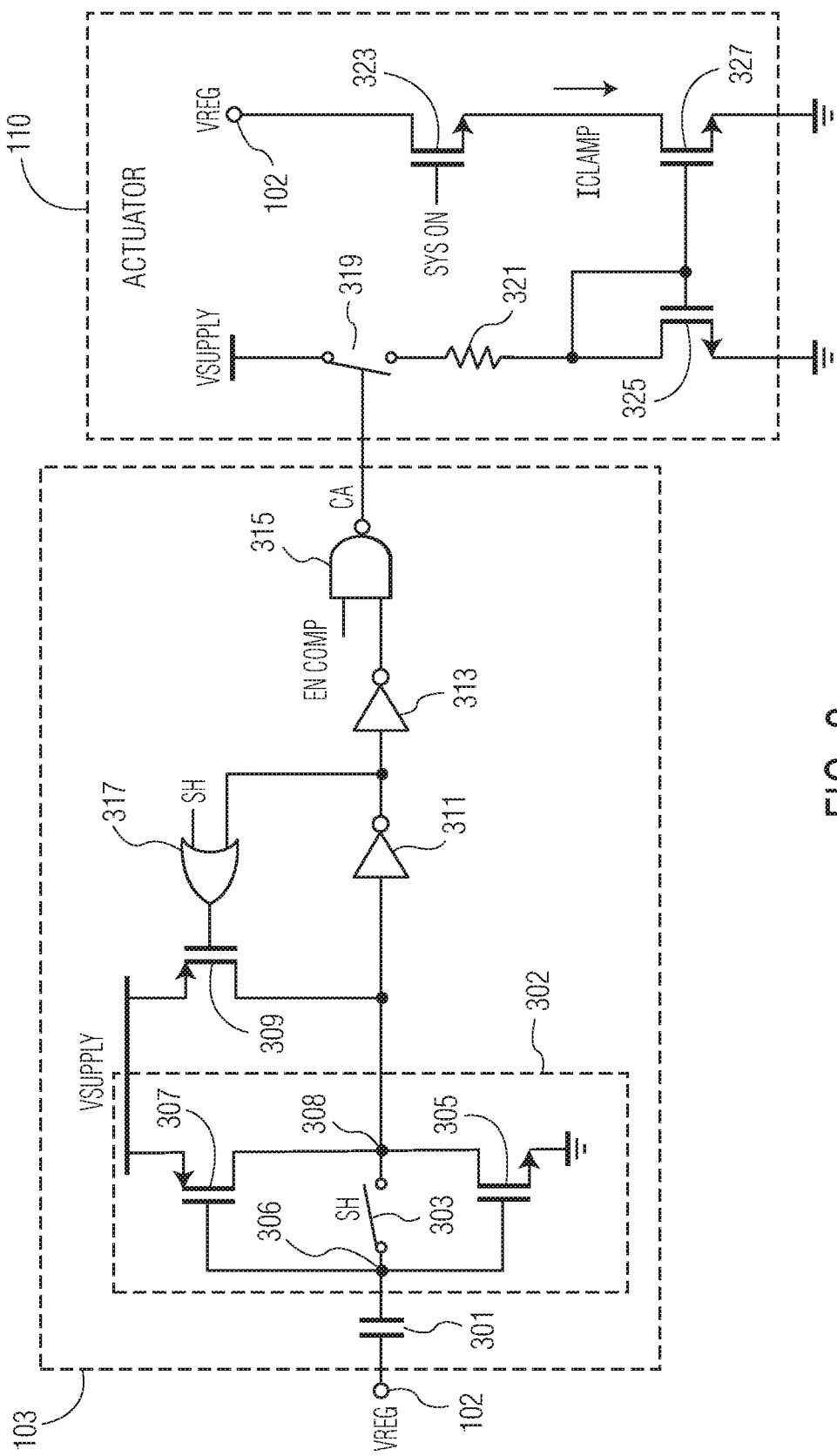
FIG. 3 is a circuit diagram of a comparison circuit and an actuator circuit according to one embodiment of the present invention.

FIG. 3 is a circuit diagram of comparison circuit 103 and actuator circuit 110 according to one embodiment of the present invention. In the embodiment of FIG. 3, circuit 103 includes a sample and hold device, which in the embodiment shown is a capacitor 301. Circuit 103 includes an inverter 302 which includes a PFET 307 and NFET 305. Circuit 103 also includes a hysteresis PFET 309, inverter 311, NOR gate 317, inverter 313, and NAND gate 315, whose output provides the CA signal.

Actuator circuit 110 includes switch 319, resistor 321, NFET 325, NFET 327, and enable NFET 323. NFET 325 an NFET 327 form a current mirror. When switch 319 is closed to activate actuator circuit 110 and the SYS ON signal is asserted to make NFET 323 conductive, the current flowing through resistor 321 from the supply voltage terminal (VSUPPLY) is mirrored as current ICLAMP through NFETs 323 and 327 to clamp the regulated voltage VREG by discharging terminal 102 towards ground.

The inverter 302 act as a comparator for comparing the regulated voltage VREG during a power transition event with a sampled voltage of VREG established during a sample phase. In the sample phase, switch 303 is closed as per the SH signal to connect the input (node 306) of inverter 302 to the output (node 308) of inverter 302. The SH signal also makes PFET 309 nonconductive (through NOR gate 317) at this time. During the sample phase, a charge is stored on capacitor 301 such that the regulator output (terminal 102) being at the sampled voltage places the input (node 306) of inverter 302 at the voltage threshold of the inverter. The voltage stored on capacitor 301 is indicative of the sampled voltage at this time.

After the sample phase, switched 303 is opened. As VREG starts to rise above the sampled voltage, the voltage at node 306 crosses the threshold voltage of inverter 302 where a low voltage (GROUND) is produced at node 308, indicating that the regulated voltage VREG is above the sampled voltage. With node 308 being at a low voltage, the output of inverter 311 is at a high voltage (VSUPPLY), the output of inverter 313 is at a low voltage, and the output (signal CA) of NAND gate 315 is at high voltage due to NAND gate 315 being enabled by the comparison enable signal (EN COMP). The CA signal being at a high voltage closes switch 319 to activate the actuator circuit 110 to reduce the charge on terminal 102.

When the regulated voltage VREG falls below the sampled voltage due to actuator circuit 110 being activated, node 308 goes high, the output of inverter 311 goes low, the output of inverter 313 goes high, and signal CA goes low to open switch 319, thereby deactivating actuator circuit 110.

Circuit 103 includes a hysteresis PFET 309 that adjusts the comparison of the regulated voltage with the sampled voltage by inverter 302 to provide hysteresis to the inverter's output. This hysteresis causes actuator circuit 110 to be activated at a higher voltage of VREG when VREG is rising than the voltage of VREG that causes actuator circuit 110 to be deactivated when VREG is falling during the clamp regulation phase. In the embodiment shown, when VREG goes higher than the sampled voltage, node 308 goes low, which causes the output of inverter 311 to go high to turn off PFET 309 (through NOR gate 317). As explained above, when node 308 goes low, actuator circuit is activated to clamp VREG, thereby reducing its voltage. As the voltage of VREG drops below the threshold of the inverter 302, the voltage of node 308 is pulled high through PFET 307 which causes the output of inverter 311 to go low, which causes actuator circuit 110 to deactivate. Inverter 311 going low also causes the output of NOR gate 317 to go low which makes PFET 309 conductive. With PFET 309 being conductive, it will take a higher voltage of VREG to pull node 308 low to activate actuator circuit 110 again. Thus, the voltage level of VREG needed to activate actuator circuit 110 when rising is higher than the voltage level of VREG needed to deactivate actuator circuit 110 when VREG is falling. In some embodiments, providing a regulator clamp circuit with hysteresis in the activation and deactivation of the actuator circuit 110 may provide for a more stable clamp circuit.

The circuit of FIG. 3 may have other configurations in other embodiments. For example, output of NOR gate 317 may be used to bias the well of PFET 307 to adjust the voltage threshold of inverter 302 to provide hysteresis to comparison circuit 103. Also, actuator circuit 110 may have different configurations in other embodiments as well. In some embodiments, NFET 325 and 327 are sized such that ICLAMP is a multiple or fraction of IREF.

Figure 4:
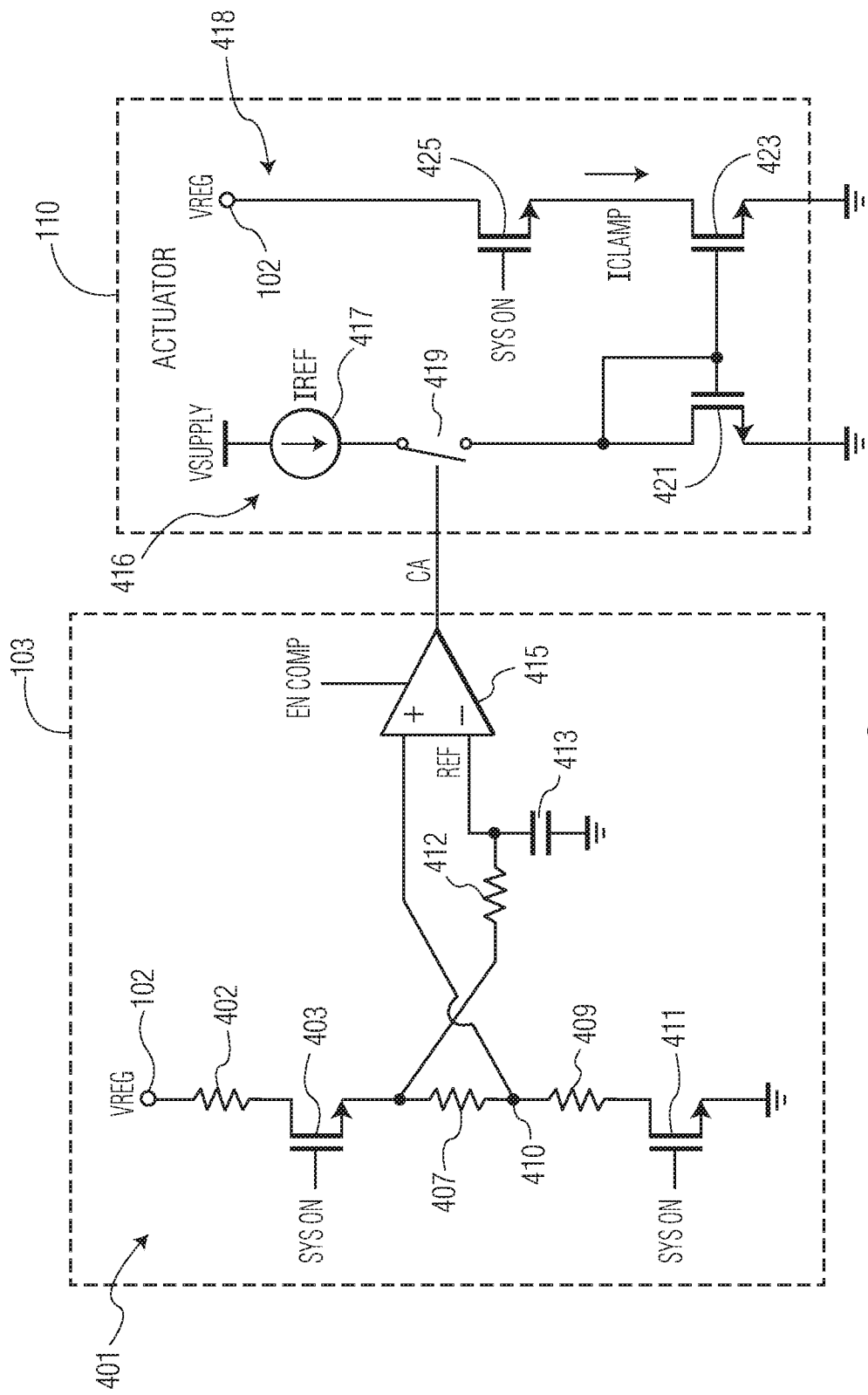
FIG. 4 is a circuit diagram of a comparison circuit and an actuator circuit according to another embodiment of the present invention.

FIG. 4 is a circuit diagram of comparison circuit 103 and actuator circuit 110 according to another embodiment of the present invention. Comparison circuit 103 includes a current path 401 from the regulator output terminal 102 to ground. Path 401 includes resistor 402, NFET 403, resistor 407, resistor 409, and NFET 411. NFETs 403 and 411 are controlled by the SYS ON signal and are only activated during the sample phase and the clamp regulation phase. Circuit 103 includes a sample and hold device, which in the embodiment shown is a capacitor 413. Capacitor 413 is coupled to path 401 through resistor 412. Circuit 103 includes a comparator 415 having a non-inverting input connected to a node 410 of path 401 and an inverting input connected to capacitor 413. The output of comparator 415 activates actuator circuit 110 by closing switch 419.

In the embodiment of FIG. 4, actuator circuit 110 includes a current source 417 that provides a current IREF in current path 416. Circuit 110 includes a current mirror of NFET 421 and NFET 423 that mirrors IREF in current path 418 for discharging regulator terminal 102. Circuit 110 includes NFET 425 that is utilized to disable actuator circuit 110 when the SYS ON signal is de-asserted. When NFET 425 is made conductive and circuit 110 is activated by switch 419 being closed, the regulated voltage (VREG) of terminal 102 is clamped by reducing the charge of terminal 102 by the rate of current ICLAMP.

With the embodiment of FIG. 4, the sampling phase is initiated with the assertion of the SYS ON signal which makes current path 401 conductive. At that time, capacitor 413 is charge from terminal 102 to a store a voltage indicative of VREG at this time.

The EN COMP signal is asserted to comparator 415 to enter the clamp regulation phase. During the clamp regulation phase, comparator 415 compares the voltage value of node 410 with the voltage (REF) stored on capacitor 413. Initially, during the sample phase, the voltage stored on capacitor 413 is higher than the voltage of node 410. During the clamp regulation phase, as the voltage of node 410 rises with VREG, it passes the voltage of capacitor 413 such that the CA signal will be asserted to activate circuit 110 to reduce the regulated voltage VREG of terminal 102. With VREG dropping in voltage, the voltage of node 410 falls below the voltage stored on capacitor 413 where comparator de-asserts the CA signal to deactivate circuit 110. In some embodiments, capacitor 413 and resistor 409 act as a low pass filter. In some embodiments, comparator 415 may implement a hysteresis function such that it has different threshold voltages for the assertion and de-assertion of signal CA.

In other embodiments, the circuit of FIG. 4 may have other configurations. For example, instead of being coupled to path 401, capacitor 413 is located in a second path (not shown) with a transistor (not shown) whose conductivity is controlled by the output of comparator 415 during the sample phase. During the sample phase, the voltage of capacitor 413 is charged to match the voltage of node 410. During the clamp regulation phase, comparator 415 does not control the transistor of the second current path (e.g. capacitor 413 and the transistor of the second current path would be separated by a switch controlled by the SH signal that is closed during the sample phase but opened during the clamp regulation phase). In such an embodiment, comparator 415 may be designed such that it does not oscillate when in a closed loop configuration. Also, actuator circuit 110 may have other configurations as well.

Figure 5:
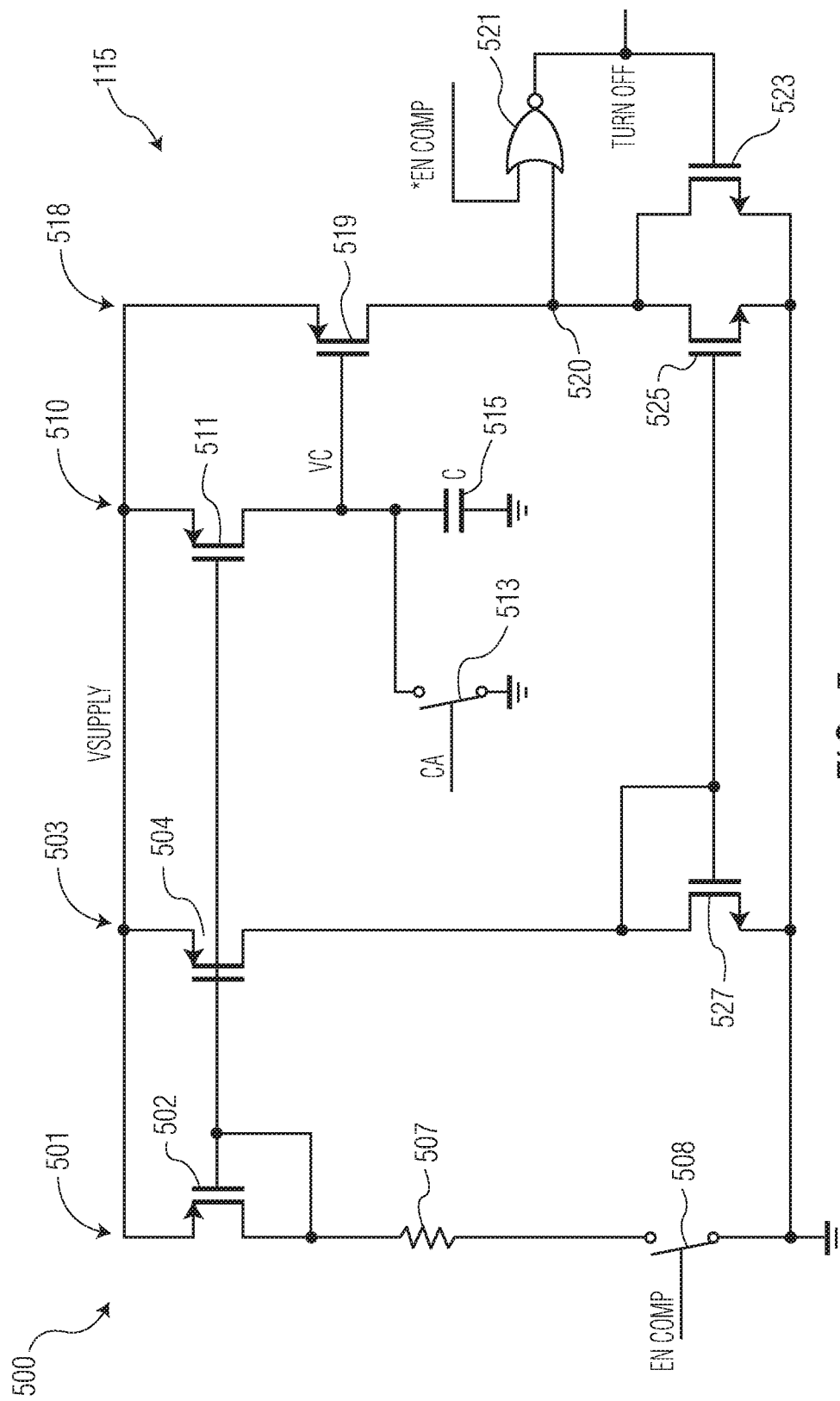
FIG. 5 is a circuit diagram of a timing circuit according to one embodiment of the present invention.

FIG. 5 is a circuit diagram of a timing circuit 500 of controller 115 that is used to determine when to end the clamp regulation phase. Circuit 500 includes current path 501 that includes PFET 502, resistor 507, and switch 508, which is controlled by the EN COMP signal. Circuit 500 includes current path 503 which includes PFET 504 and NFET 527. Current path 510 includes PFET 511 and capacitor 515. Current path 518 includes PFET 519 and NFETs 525 and 523 connected in parallel. Switch 513 is connected to capacitor 515. Circuit 500 also includes NOR gate 521 for deactivating the turn off signal when circuit 103 is not in the clamp regulation phase.

Figure 6:
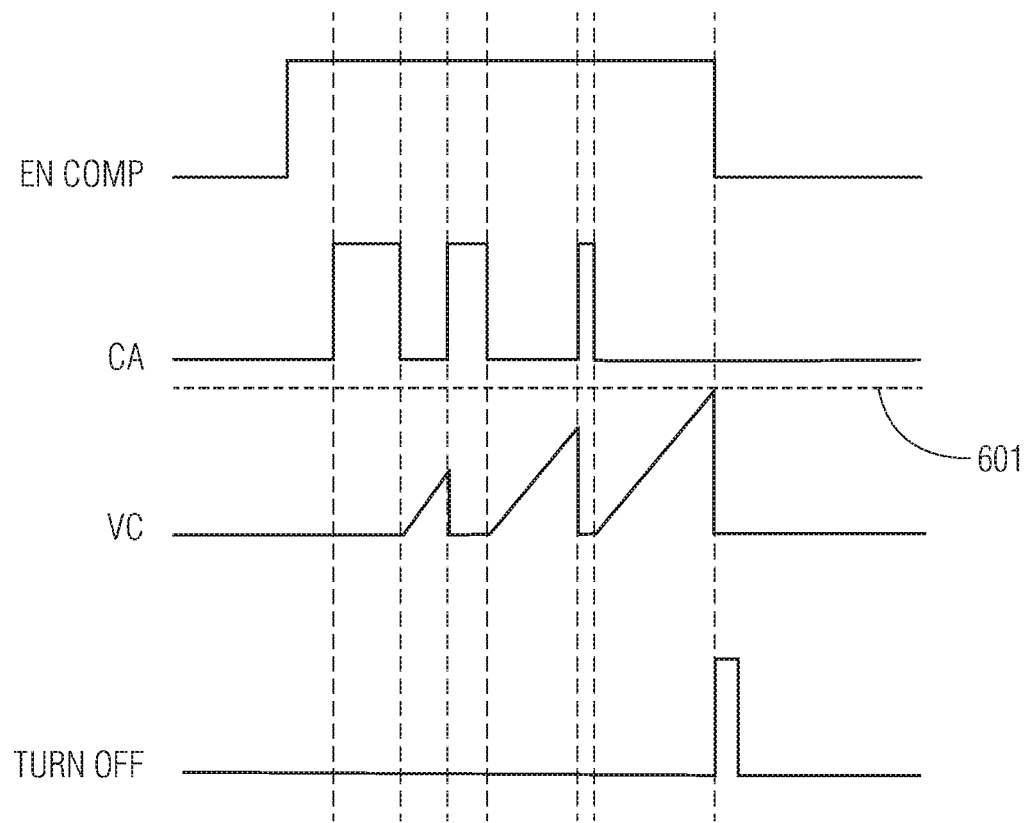
FIG. 6 is a timing diagram showing the operation of a timing circuit according to one embodiment of the present convention.

FIG. 6 shows a timing diagram of the operation of the circuit of FIG. 5. When comparison circuit 103 is enabled by the EN COMP signal to begin the clamp regulation phase, switch 508 closes which cause a current to flow through path 501. Because PFET 502, PFET 504, and PFET 511 form a current mirror, the same current is mirrored (or at multiples thereof) in current paths 503 and 510. If the CA signal is not asserted, switch 513 is open and charge accumulates on capacitor 515 such that the voltage (VC) on capacitor 515 begins to rise. At this time, because voltage VC is below the threshold voltage (601 of FIG. 6) of PFET 519, PFET 519 is conductive to pull the voltage of node 520 high. The voltage of node 520 being at a high value causes NOR gate 521 to output a low value for the TURN OFF signal.

When signal CA is asserted to activate actuator circuit 110, switch 513 is closed to discharge capacitor 515 to pull VC to ground. Once CA is de-asserted, VC begins to rise again. If the signal CA is not asserted for a long enough period of time, the voltage VC will rise above the threshold voltage 601 of PFET 519 to where PFET 519 will no longer conduct. Once this happens, the voltage of node 520 will be pulled towards ground through NFET 525 where the output of NOR gate 521 will go high activating the TURN OFF signal. The output of NOR gate 521 going high makes NFET 523 conductive to pull node 520 harder to ground. In response to the TURN OFF signal being asserted, controller 115 de-asserts the EN COMP signal (and asserts the *EN COMP signal) which cause the output of NOR gate 521 to go low, ending the TURN OFF signal pulse.

In the embodiment shown, the amount of time that the CA signal remains inactive to assert the TURN OFF signal pulse is dependent upon the current through path 510 (which is dependent upon the size of resistor 507) and the size of capacitor 515. In one embodiment, the time threshold is in the range of 10 microseconds, but may be of other values in other embodiments. One advantage that may occur with the embodiment of FIG. 5 is that the time threshold is relatively independent of supply voltage and process variation.

Circuit 500 may have other configuration in other embodiments. For example, in some embodiments, circuit 500 may utilize a clock and a counter to determine when to end the clamp regulation phase.

Figure 7:
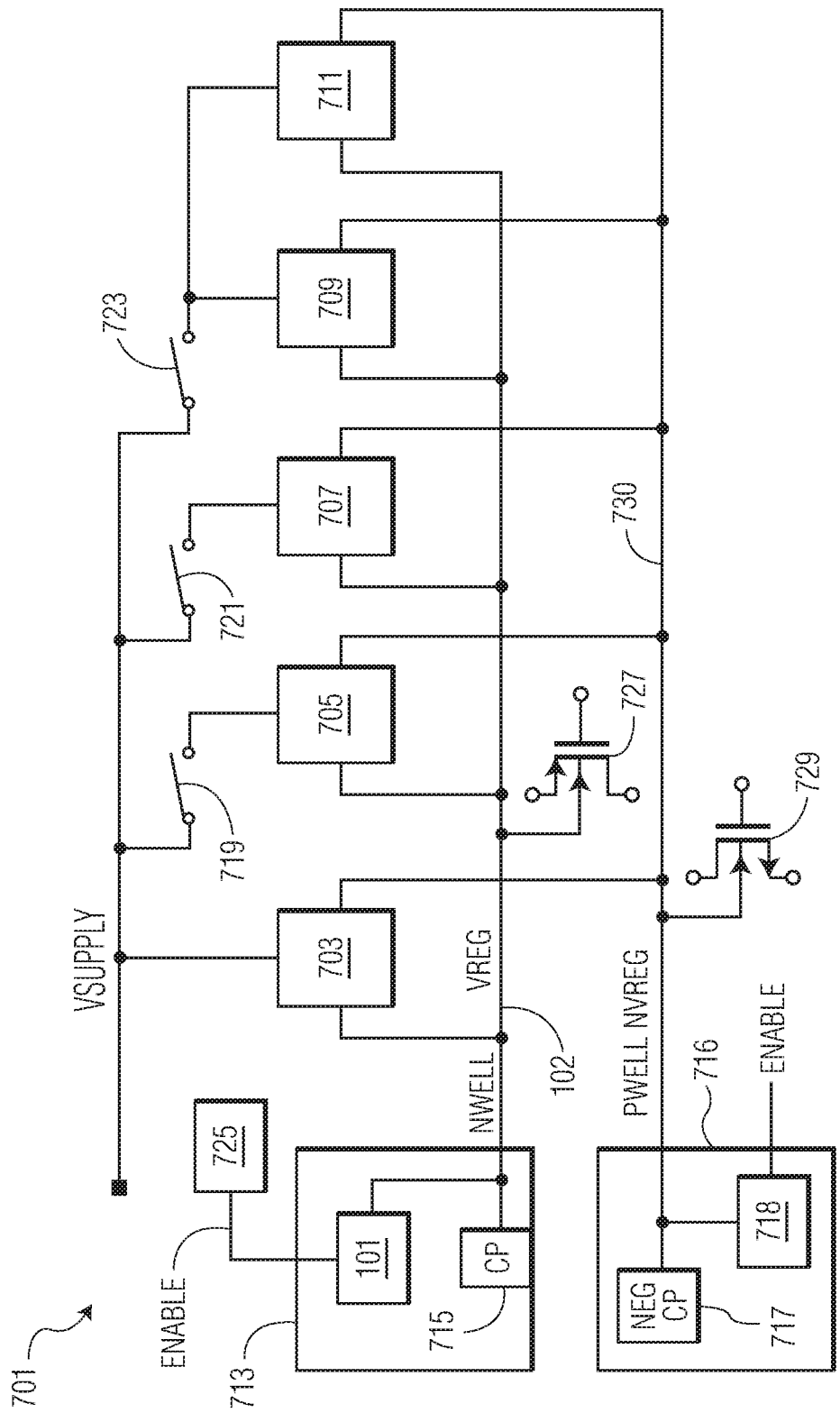
FIG. 7 is a circuit diagram of a portion of an integrated circuit according to one embodiment of the present invention.

FIG. 7 is a circuit diagram of a portion of an electronic system 701 according to one embodiment. System 701 includes a number of circuit blocks (703, 705, 707, 709, and 711), each which includes circuitry for performing functions of the system. Examples of circuitry located in the different bocks include processing, logic, analog, I/O, mixed signal, memory etc. System 701 includes switches 719, 721, and 723 that are used to selectively provide a power supply (VSUPPLY) to the different blocks. A power transition event may occur when one of switches 719, 721, and 723 is opened or closed or when VSUPPLY is raised or lowered. It may also occur with the level of operation of at least one of the blocks changes significantly. In one embodiment, the circuitry of the blocks (703, 705, 707, 709, and 711) is implemented with transistors. In one embodiment, the transistors include NFETs and PFETs, but may include other types of transistors in other embodiments.

System 701 includes a back bias voltage regulator 713 for providing a bias voltage to bias the Nwells of the PFETs of the circuitry of system 701 including PFET 727. The output (terminal 102) of regulator 713 is provided to the circuitry of each block (703, 705, 707, 709, and 711) to bias the Nwells of each block. In one embodiment, each block includes one or more terminals connected to terminal 102.

Regulator 713 includes a charge pump 715 for providing charge to terminal 102 to maintain the level of VREG during a steady state operation. In one embodiment VREG is 2.5 volts, but may be of other values in other embodiments. Regulator 713 also includes clamp circuit 101 for clamping terminal 102 during a power transition event. In the embodiment shown, regulator 713 and regulator 716 receive the ENABLE signal from power controller 725 that provides an indication that a power transition event will occur.

Back bias regulator 716 provides a negative regulated voltage (NVREG) on terminal 730 to bias the wells of the NFET transistors of system 701 including NFET 729. In one embodiment NVREG is −1 volt, but may be of other voltage values in other embodiments. Regulator 716 includes a negative charge pump 717 for providing negative charge to terminal 730. Regulator 716 also includes a clamp circuit 718 for discharging terminal 730 during a power transition event. Circuit 718 is responsive to the ENABLE signal to enter the sample and hold phase and the clamp regulation phase.

In one embodiment, the circuitry of FIG. 7 is located on a single integrated circuit. However, in other embodiments, the circuitry of FIG. 7 may be located on multiple integrated circuits. Also, in other embodiments, system 701 may include other configurations and/or other circuitry including having more than one supply voltage. The charge pumps 715 and 717 may be of any number of different charge pump configurations. Also, in some embodiments, the regulators do not include charge pumps (as with linear regulators or some switching regulators). In some embodiments, the regulator may be external to the integrated circuit of the loads.

Figure 8:
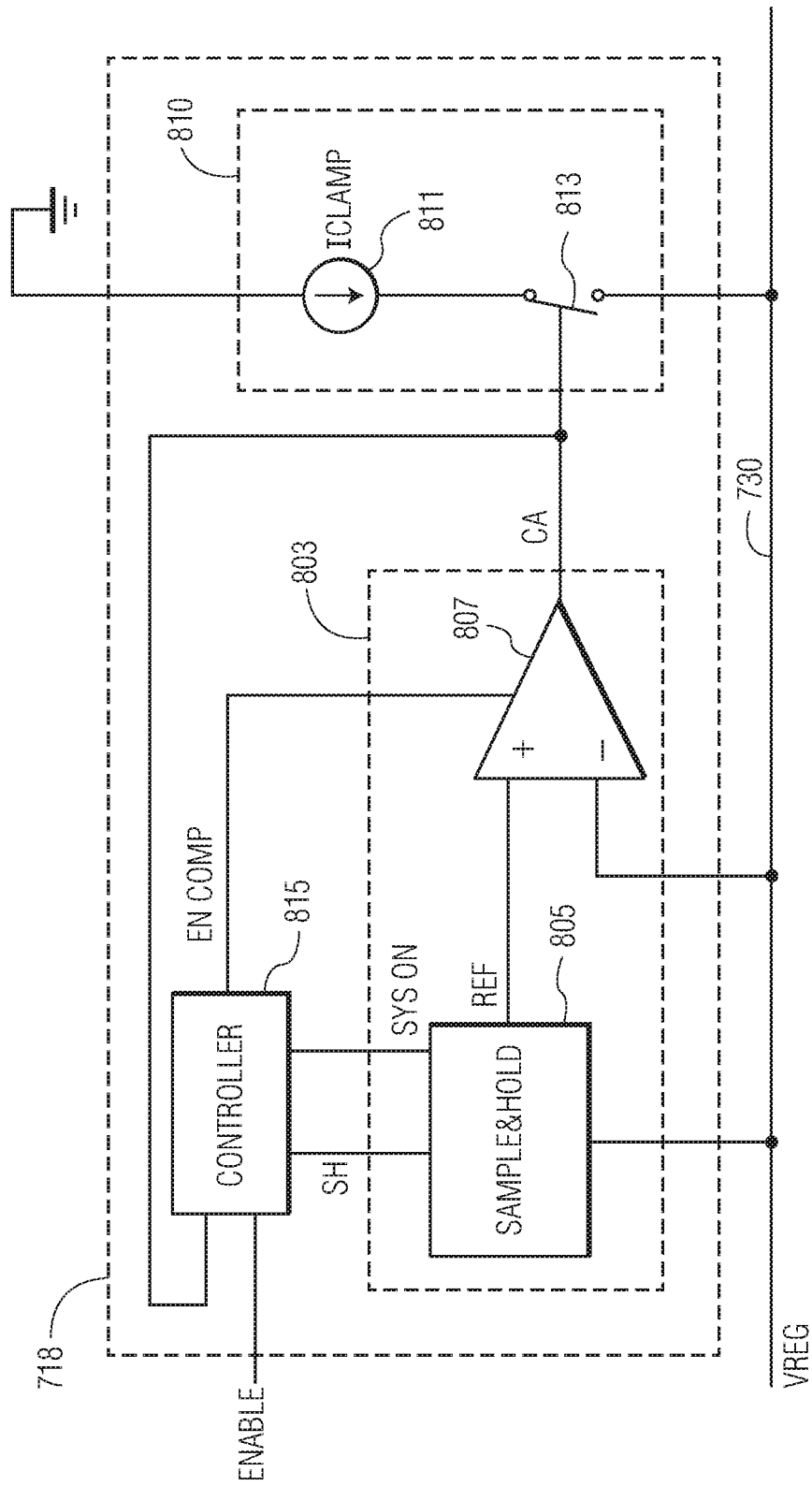
FIG. 8 is a circuit diagram of a regulator clamp circuit according to another embodiment of the present invention.

FIG. 8 shows an embodiment of regulator clamp circuit 718. The regulator clamp circuit of FIG. 8 is similar to the regulator clamp circuit of FIG. 1 except that the regulator clamp circuit of FIG. 8 clamps a negative voltage towards ground instead of a positive voltage towards ground as with the regulator clamp circuit of FIG. 1.

Clamp circuit 718 includes a comparison circuit 803 including a sample and hold circuit 805 and comparator 807. When enabled by the EN COMP signal, comparator 807 compares a sampled voltage (REF) stored in the sample and hold device (805) with NVREG and provides an output (CA) to activate actuator circuit 810. Circuit 718 includes a controller 815 for providing control signals for transitioning circuits 803 and 810 into the sample phase, from the sample phase to the clamp regulation phase, and out of the clamp regulation phase. In one embodiment, controller 815 includes a timer circuit similar to circuit 500 of FIG. 5.

When activated, actuator circuit 810 clamps the regulated voltage NREG of terminal 730 towards ground. Actuator circuit 810 includes a current source 811 for providing a current (ICLAMP) for charging terminal 730 towards ground when switch 813 is closed by the assertion of the CA signal.

In some embodiments, circuit 718 may have a similar configuration to the clamp circuit shown in FIG. 3, accounting for variations due to a negative regulated voltage being clamped. In other embodiments, circuit 718 may have a similar configuration to the clamp circuit shown in FIG. 4, accounting for variations due to a negative regulated voltage being clamped. In still other embodiments, circuit 718 may have other configurations.

In some embodiments, providing a voltage regulator with a clamp circuit that is selectively activated for power transition events may provide for a voltage regulator that is power efficient during a steady state operation and yet can provide a faster transient response during a power transition event to minimize voltage spikes. Furthermore, in some embodiments, providing a regulator clamp circuit with comparison circuitry that is disabled during a steady state operation may provide for a more efficient voltage regulator.

In addition, in some embodiments, providing a regulator clamp circuit that includes a sample and hold device for storing an indication of a sampled voltage of the regulated voltage for actuator activation may provide for a regulator clamp circuit that is able to effectively and efficiently clamp for a range of regulated voltage values. For example, if a regulator clamp circuit utilized a reference voltage for actuator activation instead of a sampled voltage, then the circuit would have to generate reference voltages of different values for the different regulated voltage values. Whereas with at least some embodiments described herein, the clamp circuit does not rely upon the generation of a particular reference voltage for actuator activation.

Furthermore, if a regulator clamp circuit utilized a reference voltage for actuator activation instead of a sampled voltage, the accuracy of a regulator during a power transition event may be reduced due to variations in the reference voltage. For example, accommodations made in the regulator design to account for variations in the reference voltage (e.g. having a higher hysteresis range) may lengthen the settling time of the regulated voltage during a power transition event. Accordingly, using a sample and hold circuit for actuator activation may provide for a voltage regulator that is faster and more efficient in responding to power transition events.

Furthermore, with some embodiments shown herein, even if the regulated voltage level is changed during operation, the regulator clamp circuit would be operable for the different voltage levels without having to be trimmed or without having to adjust the reference voltage circuit.

The switches shown in the figures (e.g. switches 111, 513, 719, 813) may be implemented with a number of switching devices such as e.g. bipolar transistors, MOSFETS, pass gates, etc.

The circuitry, features and/or methods described with respect to one embodiment may be implemented with the circuitry, features and/or methods of the other embodiments. For example, the actuator of FIG. 3 may be used with the comparison circuit 103 of FIG. 1 or with the comparison circuit of FIG. 4.

In one embodiment, a circuit includes a comparison circuit including an output indicative of a comparison of a regulated voltage with a sampled voltage. The sampled voltage is indicative of the regulated voltage during a previous time. The comparison circuit including a sample and hold device for storing an indication of the sampled voltage. The circuit includes an actuator circuit for clamping the regulated voltage when activated. The actuator circuit is activated in response to the output of the comparison circuit.

Another embodiment includes a method for providing a regulated voltage. The method includes providing a regulated voltage at a terminal. In a steady state phase of operation, an actuator circuit coupled to the terminal is not activated. The method includes sampling the regulated voltage using a sample and hold device during the steady state phase to establish a sampled voltage of the regulated voltage. The method includes after the sampling, during a clamp regulation phase of operation, providing at an output of a comparison circuit, an indication of a comparison between the regulated voltage and the sampled voltage. An actuator circuit is activated to clamp the regulated voltage provided the terminal responsive to the output of the comparison circuit.

While particular embodiments of the present invention have been shown and described, it will be recognized to those skilled in the art that, based upon. the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
   a comparison circuit including an output indicative of a comparison of a regulated voltage with a sampled voltage, wherein the sampled voltage is indicative of the regulated voltage during a previous time, the comparison circuit including a sample and hold device for storing an indication of the sampled voltage;
   an actuator circuit for clamping the regulated voltage when activated, wherein the actuator circuit is activated in response to the output of the comparison circuit.

2. The circuit of claim 1 further comprising:
   control circuitry, wherein the control circuitry disables comparison by the comparison circuit during a time when a voltage regulator is providing the regulated voltage during a steady state phase of operation, wherein the actuator circuit is not activated during the steady state phase.

3. The circuit of claim 1, wherein during a sample phase, an indication of the sampled voltage is stored in the sample and hold device, wherein during a clamp regulation phase, the comparison circuit is enabled after the sample phase to provide an indication at its output of a comparison between the regulated voltage and the sampled voltage.

4. The circuit of claim 3 further comprising control circuitry, wherein the control circuitry initiates the sample phase in response to a power transition event.

5. The circuit of claim 3 further comprising a timing circuit for providing a signal for disabling the comparison circuit after the actuator circuit has not been activated for a time threshold during the clamp regulation phase.

6. The circuit of claim 1 further comprising:
   a voltage regulator output, wherein the regulated voltage is provided at the voltage regulator output, the circuit includes a charge pump for providing charge to the voltage regulator output for providing the regulated voltage.

7. The circuit of claim 1 wherein the regulated voltage is a positive voltage and the actuator circuit discharges the regulated voltage towards ground when activated.

8. The circuit of claim 1 wherein the regulated voltage is a negative voltage and the actuator circuit charges the regulated voltage towards ground when activated.

9. The circuit of claim 1 wherein the sample and hold device includes a capacitor.

10. The circuit of claim 9 wherein the capacitor includes a first electrode coupled to a terminal for supplying the regulated voltage, the capacitor including a second electrode coupled to an input of an inverter of the comparison circuit.

11. The circuit of claim 10, wherein during a sample phase, the input of the inverter is shorted to an output of the inverter.

12. The circuit of claim 10 wherein during a sample phase, a charge is stored on the capacitor such that the terminal being at the sampled voltage places the input of the inverter at a voltage threshold of the inverter, wherein an output of the inverter provides an indication of a relationship between the regulated voltage and the sampled voltage during a clamp regulation phase after the sample phase, wherein during the clamp regulation phase, the output of the comparison circuit is responsive to the output of the inverter.

13. The circuit of claim 9 wherein the comparison circuit includes a comparator including a first input coupled to the capacitor and a second input coupled to a terminal providing the regulated voltage during a clamp regulation phase, the output of the comparison circuit is responsive to an output of the comparator.

14. The circuit of claim 1 further comprising:
   a plurality of transistors, wherein the regulated voltage is utilized for well region biasing of the plurality of transistors.

15. A method for providing a regulated voltage, the method comprising:
   providing a regulated voltage at a terminal, wherein in a steady state phase of operation, an actuator circuit coupled to the terminal is not activated;
   sampling the regulated voltage using a sample and hold device during the steady state phase to establish a sampled voltage of the regulated voltage;
   after the sampling, during a clamp regulation phase of operation, providing at an output of a comparison circuit, an indication of a comparison between the regulated voltage and the sampled voltage, wherein the actuator circuit is activated to clamp the regulated voltage provided at the terminal responsive to the output of the comparison circuit.

16. The method of claim 15 wherein the providing the regulated voltage at a terminal includes providing charge to the terminal from a charge pump.

17. The method of claim 15, wherein the regulated voltage is utilized for well region biasing of a plurality of transistors of an integrated circuit.

18. The method of claim 17 wherein the sampling and the clamp regulation phase are performed in response to an anticipated power transition event.

19. The method of claim 15, wherein the sampling includes storing a charge provided by the terminal on a capacitor.

20. The method of claim 15 wherein the providing at an output of a comparison circuit, an indication of a comparison between the regulated voltage and the sampled voltage further includes the actuator circuit being activated when the regulated voltage transitions in a first direction past a first voltage level, and being deactivated when the regulated voltage transitions in a second direction opposite the first direction, past a second voltage level, the first voltage level is different than the second voltage level.

21. The method of claim 15 wherein:
   the sample and hold device includes a capacitor;
   the sampling includes storing charge on a capacitor from the terminal such that the terminal being at the sampled voltage places an input of an inverter of the comparison circuit at a voltage threshold of the inverter, the capacitor is coupled to the input;

the providing at an output of a comparison circuit includes the output of the inverter providing an indication of a relationship between the regulated voltage and the sampled voltage during the clamp regulation phase, the output of the comparison circuit responsive to the output of the inverter during the clamp regulation phase.

22. The method of claim 15 wherein:

the sample and hold device includes a capacitor;

the sampling includes storing charge on the capacitor from the terminal, the capacitor coupled to a first input of a comparator of the comparison circuit;

during the clamp regulation phase, a second input of the comparator is coupled to the terminal, the providing at an output of a comparison circuit includes the actuator circuit being activated to clamp the regulated voltage provided at the terminal responsive to the output of the comparator.

23. The method of claim 15 further comprising, exiting the clamp regulation phase and disabling the comparison circuit in response to the actuator circuit not being activated for a time threshold during the clamp regulation phase.

* * * * *